United States Patent [19]

Shen et al.

[11] Patent Number: 5,705,840

[45] Date of Patent: Jan. 6, 1998

[54] FIELD EFFECT TRANSISTOR WITH RECESSED BURIED SOURCE AND DRAIN REGIONS

[75] Inventors: Shing-Ren Shen, Tao-Yuan; Kuan-Cheng Su, Taipei; Chen-Hui Chung, Hsin-Chu, all of Taiwan

[73] Assignee: United Microelectronics Corporation, Hsin-Chu, Taiwan

[21] Appl. No.: 636,785

[22] Filed: Apr. 23, 1996

Related U.S. Application Data

[60] Continuation of Ser. No. 371,385, Jan. 11, 1995, abandoned, which is a division of Ser. No. 254,534, Jun. 6, 1994, Pat. No. 5,382,534.

[51] Int. Cl.⁶ .............................. H01L 29/76; H01L 29/94
[52] U.S. Cl. ................................ 257/344; 257/408
[58] Field of Search ............................ 257/330, 331, 257/333, 336, 344, 408; 29/578; 437/2, 35

[56] References Cited

U.S. PATENT DOCUMENTS

| | | | |
|---|---|---|---|
| 4,653,177 | 3/1987 | Lebowitz et al. | 29/578 |
| 5,041,885 | 8/1991 | Gualandris et al. | 257/344 |
| 5,114,865 | 5/1992 | Kimura | 437/2 |
| 5,118,636 | 6/1992 | Hosaka | 437/35 |
| 5,156,985 | 10/1992 | Yamada et al. | 437/35 |

FOREIGN PATENT DOCUMENTS

| | | | |
|---|---|---|---|
| 63-73666 | 4/1988 | Japan | 257/344 |
| 63-90853 | 4/1988 | Japan | 257/408 |
| 4-212466 | 8/1992 | Japan | 257/344 |

*Primary Examiner*—Steven H. Loke
*Attorney, Agent, or Firm*—William H. Wright

[57] ABSTRACT

The invention describes recessed source/drain regions formed in trenches in the substrate that provide a smooth surface topology, smaller devils and improved device performance. The recessed source/drain regions have two conductive regions: the first upper lightly doped region on the trench sidewalls, and the second lower region under the trench bottom. In addition, two buried layers are formed between adjacent source/drain regions: a threshold voltage layer near the substrate surface and an anti-punchthrough layer formed at approximately the same depth as the lower source/drain regions on the trench bottoms. The upper lightly doped source/drain region and the anti-punchthrough layer have the effect of increasing the punchthrough voltage without increasing the threshold voltage. The upper and lower source/drain regions lower the overall resistivity of the source/drain allowing use of smaller line pitches and therefore smaller devils. Overall, the recessed source/drain regions and the two buried layers allow the formation of smaller devices with improved performance.

1 Claim, 3 Drawing Sheets

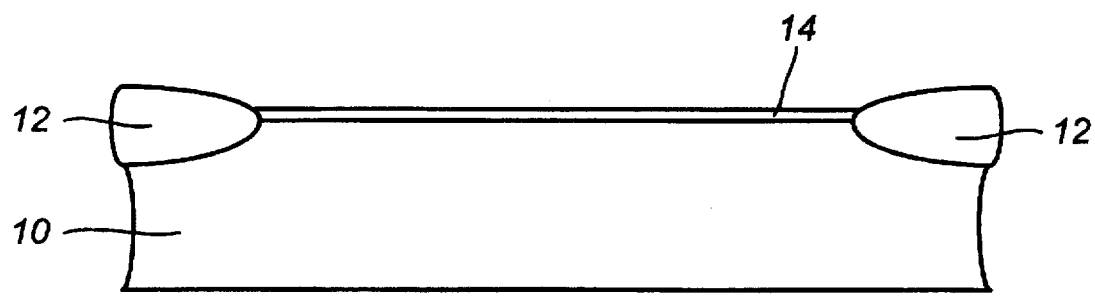
*FIG. 1 -- Prior Art*
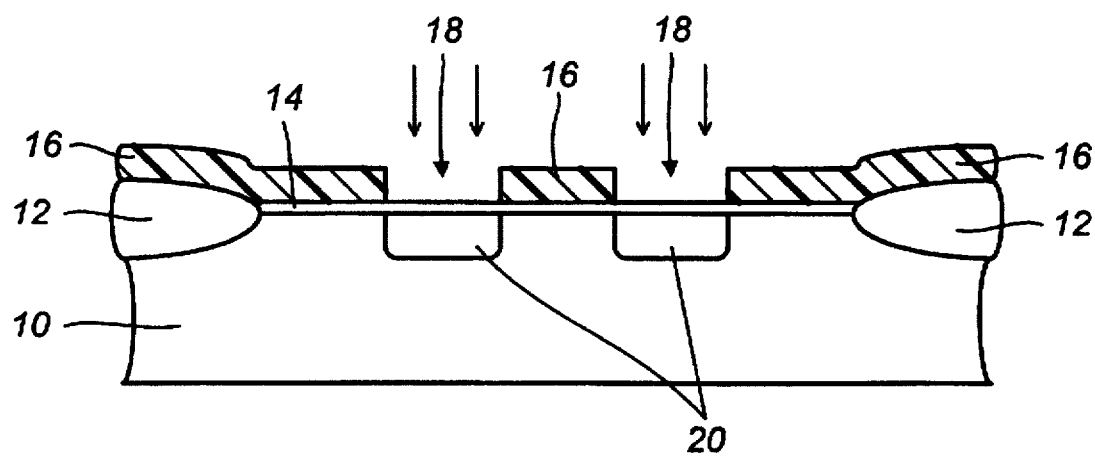
*FIG. 2 -- Prior Art*
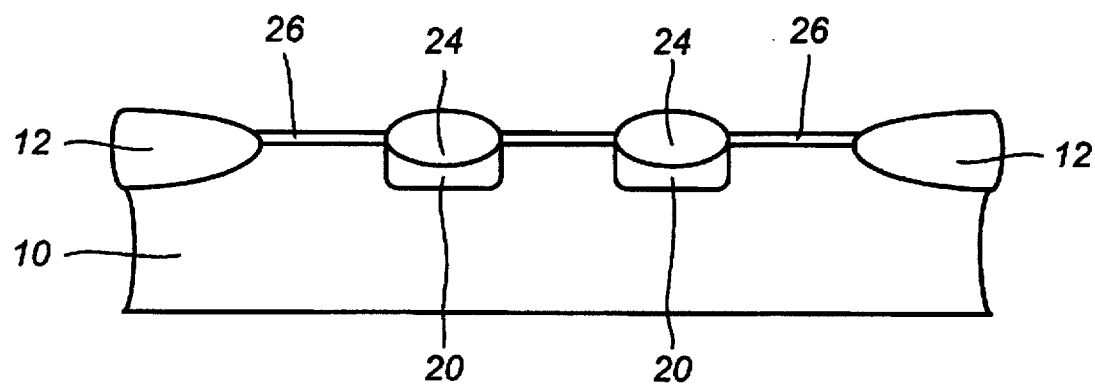
*FIG. 3 -- Prior Art*

FIELD EFFECT TRANSISTOR WITH RECESSED BURIED SOURCE AND DRAIN REGIONS

This is a continuation of application Ser. No. 08/371,385 filed on Jan. 11, 1995, now abandoned, which is a division of application Ser. No. 08/254,534 filed on Jun. 6, 1994, now U.S. Pat. No. 5,382,534.

BACKGROUND OF INVENTION

1) Field of the Invention

This invention relates to semiconductor devices and more particularly to an improved structure and method for producing field effect transistor devices.

2) Description of the Prior Art

As integrated logic and memory circuit devices are microminiaturized, individual element are packed more closely and element size is reduced. Microminiaturization increases the speed of operation and reduces the production costs. In order to achieve this, each memory element must occupy less space on the device. Also, to reduce production costs, the process must be easy to reproduce and the device designed to increase manufacturing yields.

In particular, as memory and logic devices are scaled down in size, there is a continuous challenge is to produce buried source and drain regions with smaller line pitches and lower sheet resistance. However, as line pitches decrease, the buried line sheet resistance increases. Moreover, as the line sheet resistance increase, memory and logic circuit performance decrease. These relationships present the process designer with a trade off problem between smaller buried conductive regions and better circuit performance.

Smaller buried conductive regions create other process related problems. Buried conductive lines are designed with higher impurity concentrations to lower the line resistivity. During oxidation processes, the highly doped line areas oxidize at a higher rate than the lower doped surrounding areas. This enhanced oxidation rate is a function of the doping level of the highly doped line areas, but with the usual doping levels, the doped areas oxidize about four times as fast as the undoped areas. This enhanced oxidation creates surface topology steps between the non-doped device areas and the doped line area. The surface topology can cause yield problems in subsequent layers. The topology can cause photolithography depth of field and focusing problems. Another problem caused by the enhanced oxidation is that polysilicon layers have notching problems when applied over uneven topologies. Therefore, the ideal buried conductive region has a small pitch, a low resistivity and an even surface topology after subsequent oxidations.

In conventional processes for forming buried conductive lines a field oxidation 12 is formed on the substrate surface in non-device areas as shown in FIG. 1. For this example, the substrate 10 is P-type and the conductive lines to be formed will be N-type. The opposite impurity types could be used. Also, an opposite impurity well formation could be used to form both conductivity type devices on the same substrate. Next, a gate oxide 14 is formed over the areas between the field oxide regions 12.

At this point, a first ion implantation (not shown) of P-type ions, called a threshold voltage implant, is performed on regions not covered by the field oxide. The threshold voltage implant's purpose is to increase the threshold voltage of the transistor devices. The threshold voltage is the gate-to-source voltage below which the drain-to-source current effectively drops to zero. Next, another ion implantation (not shown) of P-type ions at a higher implant energy, called a anti-punch through implantation, can be performed on the same regions not covered by field oxide. This implant is designed to increase the device punch-through voltage. Punchthrough can occur if very high voltages are applied to the drain. Under these circumstances, the gate had no control over the drain current. The higher the punch-through voltage the wider the device operating voltage range and the better the device.

Subsequently, as shown in FIG. 2, a resist layer 16 is formed having openings 18 in areas which will define the conductive lines. N-type impurity ions are ion implanted through the resist openings 18 to form doped regions 20. The resist is removed and the doped regions are annealed to electrically activate the implanted ions and form the buried conductive regions 20. Next the substrate is oxidized to form a second gate oxide layer 26 as shown in FIG. 3. However, the surface of the buried conductive line region oxidizes at a faster rate than the lower doped surrounding areas as is well known. This enhanced oxidation creates a step topology 24. This step topology 24 can cause the previously mentioned processing problems: photolithography depth of field focus problems and notching problems in the subsequent polysilicon layers.

Lebowitz et al. U.S. Pat. No. 4,653,177 discloses a method for fabricating and selectively doping isolation trenches in complementary-metal-oxide-semiconductor devices (CMOS). The invention describes two non-lithographic techniques where selective anodic oxidation is used to selectively mask the sidewalls of the trenches. The first technique to anodize the p-type trench isolations regions begins by preferentially etching the p-type regions followed by an oxidation of the etched p-type areas. The second technique to anodize the p-type isolation regions uses a dry anodization process in a plasma environment. These non-lithographic masking techniques are followed by an introduction of a n-type impurity into the unmasked areas. The n-type impurity can be introduced in several ways: ion implantation, n-doped polysilicon layer diffusion, and diffusion for gases or solids.

Yamada et al. U.S. Pat. No. 5,156,985 discloses a method for making a charge transfer semiconductor device having an oblong trench. The invention describes forming a trench with two layers, a N-type layer and a P-type layer, on the trench sidewalls and bottom. These layers can have different doping levels on the trench sides and bottom. The trench sidewalls are doped using a oblique ion implantation. The trench bottom is doped using a vertical (90 degree) ion implantation.

Hasaka U.S. Pat. No. 5,118,636 teaches a process for forming an isolation trench in previously implanted region. The invention has two basic steps: 1) forming a doped region by ion implantation, and 2) forming a trench in the ion implanted region.

Kimura U.S. Pat. No. 5,114,865 discloses a process to manufacture a solid-state image sensing device having a overflow drain structure. The invention describes the formation of metal-oxide semiconductor (MOS) devices (overflow drain structure and an optoelector transducer) inside trenches. The trenches have three different doped regions, one N-type and two P-type. The doped regions serve as drain and channel and other elements. The trench walls are implanted at oblique angles to form one N-type and one P-type layer. The other P-type region is formed in the substrate before the trench is etched.

SUMMARY OF INVENTION

An object of the present invention is to provide an improved structure for a field effect transistor which has spaced buried conductive regions with a smooth surface topology.

A more specific object of the present invention is to provide an improved structure for a field effect transistor which has buried source and drain regions with lightly doped sidewall regions which improve the device performance and punch through voltage while maintaining the transistor's threshold voltage.

Another object of the present invention is to provide a process to fabricate an improved field effect transistor device with buried conductive regions that have a smooth topology which improves the manufacturing device yields.

Still another object of the present invention is to provide a process to fabricate an improved field effect transistor device with buried conductive regions that has lightly doped sidewalls which improve device punchthrough voltage.

In accordance with the above objects, a structure and process for fabricating an improved field effect transistor device having improved buried source and drain regions on a semiconductor substrate is provided. First, a plurality of field oxide regions are formed on the substrate surface. Next, a first gate oxide is grown on the substrate surface. A resist layer having openings that define a pattern of elongated spaced parallel lines is formed. Subsequently, the exposed portions of the substrate are etched providing a pattern of elongated spaced parallel trenches.

Impurity ions of a second conductivity type are obliquely injected through the openings in the resist to form a first buried implanted regions at the trench sidewalls and bottom. Next, a second ion implantation vertically injects ions of a second conductivity type through the openings to form second buried implanted regions at the trench bottoms.

The first and second implanted regions are annealed to electrically activate the impurity atoms to form buried conductive lines. A second gate oxide layer is grown in the trench. The enhanced oxidation of the doped trench surface allows the second gate oxide to grow to approximately the same height as the oxide in the adjacent substrate surface. Lastly, the field effect transistor is completed using conventional semiconductor fabrication techniques.

BRIEF DESCRIPTION OF THE DRAWINGS

The drawings show the following:

FIGS. 1 through 3 are sequence of cross-sectional views in broken section in greatly enlarged scale that illustrate a process for forming buried conductive lines in accordance with the prior art.

DETAILED DESCRIPTION OF THE PREFERRED EMBODIMENTS

The present inventions will be described in detail with reference to the accompanying drawings. It should be noted that the drawings are in greatly simplified form. In practice the memory device structure will be one of many supported on a common substrate connected with suitable metallurgy in various known electronic circuit configurations.

Figure 4:
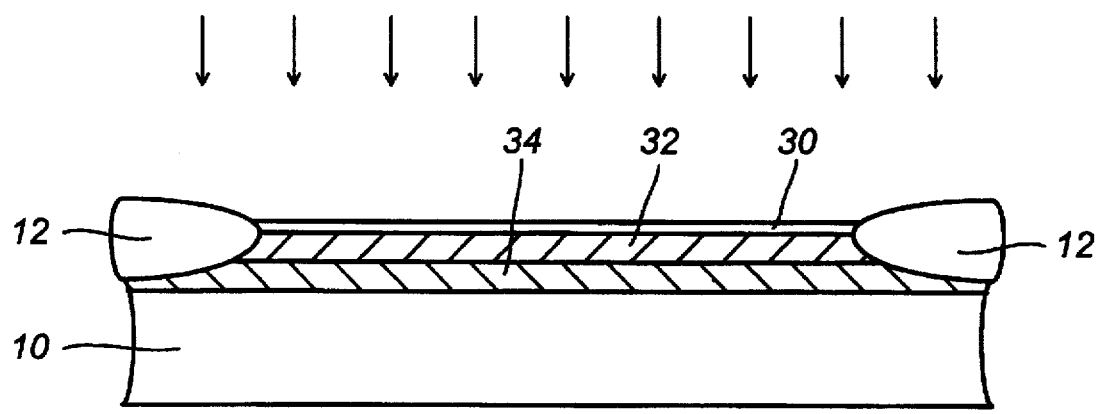
FIGS. 4 through 7 are a sequence of cross-sectional views in broken section in greatly enlarged scale that illustrate a process for forming buried conductive lines at various stages of fabrication in accordance with the process of the invention.

As shown in FIG. 4, the substrate 10 shall be a monocrystalline silicon semiconductor body with many devices (not shown) fabricated therein, as is well known in the art. The substrate 10 is preferable formed of monocrystalline silicon having a surface plane with a crystalline orientation of <100>. The background substrate dopant is of a first impurity type and is preferably boron ($B_{11}$), with a concentration in the range of 1E14 to 1E15 atoms/$cm^3$. The background impurity can be P or N-type. For this example P-type will be used. An alternative method uses a well structure with a doping of a second impurity type. With a well structure, both P and N type devices can be formed on the same substrate.

Next, a masking layer (not shown) is formed on the substrate surface that is capable of masking the underlying substrate against oxidation. The masking layer can be formed of silicon nitride. The masking layer has a thickness in the range of 1000 to 2000 angstroms, more preferably approximately 1500 angstroms. Openings are formed in the masking layer which define field oxide regions 12. As shown in FIG. 4, a plurality of field oxide regions 12 in the substrate 10 are formed in the mask openings. The field oxide regions 12 have a thickness in the range of 4000 to 8000 angstroms and more preferably have a thickness of 5800 angstroms. The remaining masking layer is then removed.

Field oxide regions can be formed as described in F. Kooi U.S. Pat. No. 3,970,486. Surfaces portions of a silicon substrate are masked against oxidation. The exposed unmasked surface is oxidized to grow a thermal oxide which in effect sinks into the silicon at the unmasked areas. The masked silicon remains as a mesa surround by the sunken silicon dioxide that is available for fabrication of devices. Silicon oxide can be grown at atmospheric pressure at 700° to 1200° C. in a wet ambient in a thermal furnace.

A first gate oxide 30 is formed on the substrate surface. The gate oxide layer 30 can be formed by a thermal oxidation process at a temperature in the range of 725° to 1000° C. and preferably a temperature of 900° C. In the alternative, the gate oxide layer 30 can be formed by an atmospheric or low pressure chemical vapor deposition process as is well known. The gate oxide layer 30 has a thickness in the range of 200 to 400 angstroms and more preferably a thickness of 300 angstroms.

Figure 7:
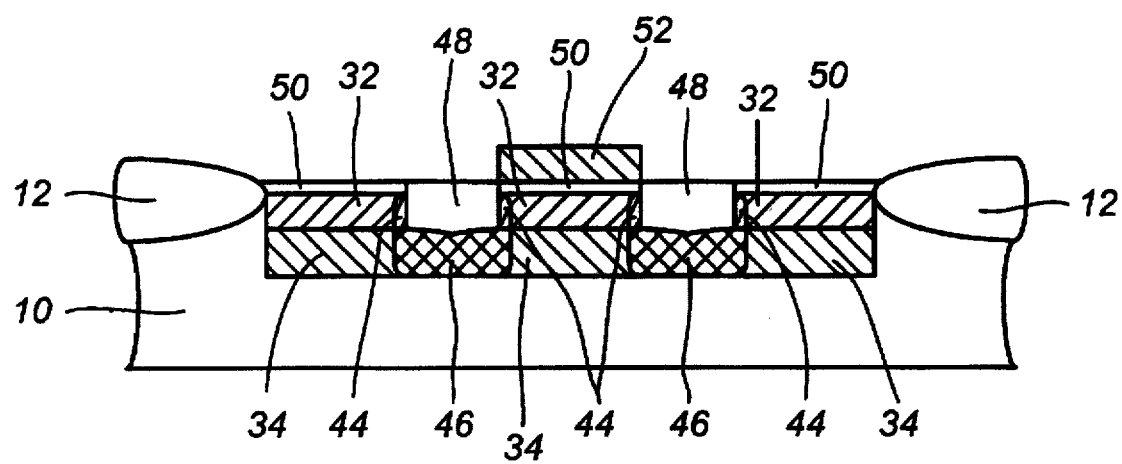

The next two ion implantation steps, the threshold voltage implant layer 32 and the anti-punchthrough implant layer 34, are shown only in FIGS. 4 and 7.

To form the lightly doped threshold voltage layer 32, the substrate 10 is implanted with P-type impurity ions using the field oxide as an implant mask. The layer 32 improves the device threshold voltage by balancing the NMOS and PMOS threshold voltage to approximately 0.8 volts. The ion implantation of $BF_2$ ions has a dosage preferably in the range of 1E12 to 1E13 atoms/$cm^2$ and an implant energy in the range of 50 to 70 Kev. In the alternative boron ions can be implanted with a dose in the range of 10 to 20 Kev. The impurity concentration of this first lightly doped layer 32 is in the range of 5E17 to 8E16 atoms/$cm^3$ and more preferably 2E17 atoms/$cm^3$. The depth of the first lightly doped layer 32 is in the range of 600 to 1200 angstroms. This first lightly doped layer 32 is used to balance N-metal oxide semiconductor (NMOS) and P-metal oxide semiconductor (PMOS) transistor threshold voltages at approximately 0.8 volts.

Subsequently, a second lightly doped layer 34 called a anti-punchthrough layer, can be formed. This layer 34 improves the punchthrough voltage between two adjacent buried source and drain regions. P-type impurity ions are implanted into the substrate forming a second lightly doped layer 34 beneath the first lightly doped layer 32. The ion implantation has a dosage in the range of 1E11 to 1E13 atoms/cm$^2$ and an implant energy in the range of 60 to 120 Kev. Preferably boron ions are implanted. The impurity concentration of this second lightly doped layer 34 is in the range of 1E16 to 1E18 atoms/cm$^3$ and more preferably 5E17 atoms/cm$^3$. The second lightly doped layer 34 has a depth in the range of 2000 to 3500 angstroms and more preferably a depth of 3000 angstroms.

Figure 5:
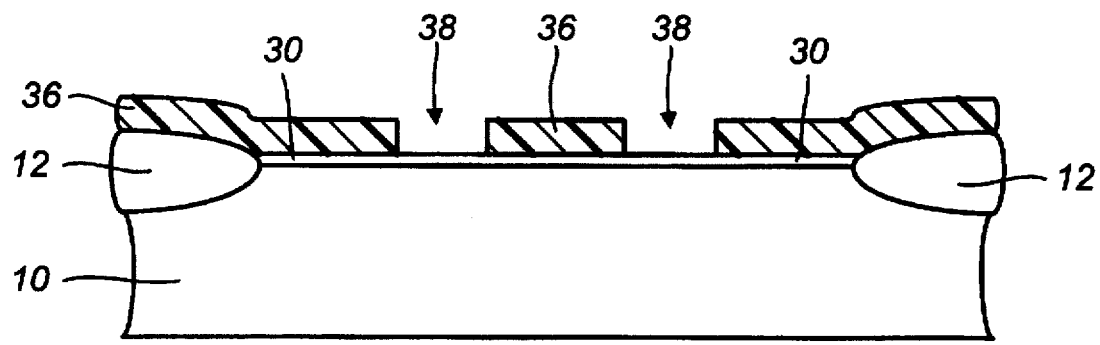

Following this, as shown in FIG. 5, a resist layer 36 is formed over the first gate oxide having a pattern of elongated spaced parallel openings 38. Resist layer's 36 thickness should be less or equal to 1 μm. Now, the gate oxide in the openings is removed by a dry etch process, such as a plasma etch using CHF$_3$ and O$_2$ in a 10:1 ratio and a plasma power of approximately 2000 Watts.

Figure 6:
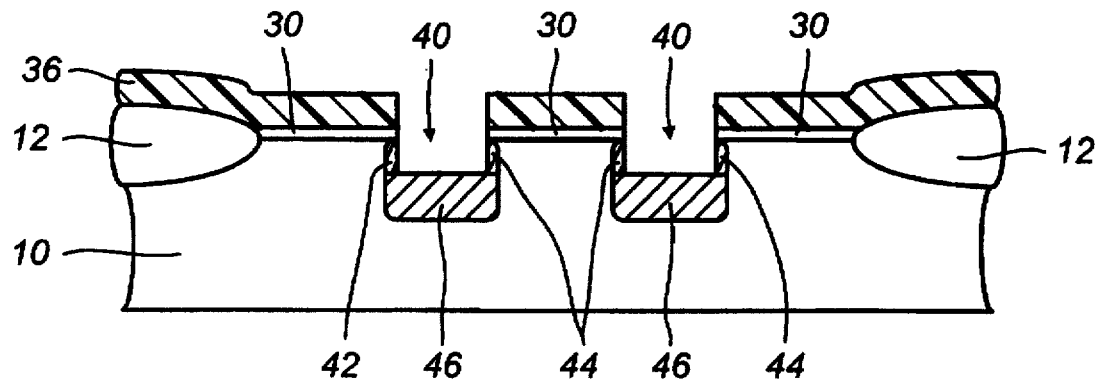

Next, as shown in FIG. 6, shallow trenches 40 are etched in the substrate 10 through the resist openings 38. The substrate 10 can be etched using a dry etch, such as a plasma etch using Cl$_2$ and He with a 2:1 ratio and a plasma power of approximately 300 Watts. The trenches 40 preferably have a depth in the range of 400 to 800 angstroms and a width in the range of 0.4 to 1 micron.

N-type ions are obliquely injected through the openings 38 forming first buried implanted regions 44 in the trench sidewalls and also in the trench bottoms. Preferably, the N-type ion implanted are phosphorus ions. The ion implantation dosage is in the range of 1E13 to 1E14 atoms/cm$^2$ and an implant energy is in the range of 30 to 80 Kev. The injection angle α has a range between 7 and 45 degrees with 360° wafer rotation. The first buried implant regions 44 have a concentration in the range of 1E18 to 1E19 atoms/cm$^3$ and more preferably a concentration of approximately 5E18 atoms/cm$^3$.

Subsequently, N-type ions are implanted vertically at 0 degrees, through the openings forming second buried implanted regions 46 in the trench bottom. Preferably, the N-type ions are arsenic ions. The ion implantation dose was in the range of 1E15 to 1E16 atoms/cm$^2$ and an implant energy in the range of 60 to 100 Kev. The second buried implant regions have a concentration in the range of 1E20 to 1E21 atoms/cm$^3$ and more preferably a concentration of approximately 5E20 atoms/cm$^3$. The resist layer 36 and first gate oxide layer 30 are removed.

Next, the first and second implanted regions are annealed to electrically activate the impurity atoms to form buried conductive lines. Now a second gate oxide layer 48 is formed in the trenches so that the second gate oxide layer 48 is approximately the same height of the adjacent oxide surface on the substrate surface 50. This forms a smooth surface topology. This second gate oxide layer 48 over the doped regions 46 in the trenches grows faster than the surface oxidation layer 50. This is because the oxidation rate of doped silicon is from two to four times as fast as the rate for undoped silicon. Also, the anneal step and the oxidation step can be combined into one process step. The second gate oxide layer 48 as a thickness in the range of 600 to 1400 angstroms and more preferable on the order of 1000 angstroms. Gate electrode 52 is formed on the surface of the substrate overlying the area between the lower source and drain regions 46 as shown in FIG. 7. Gate electrode 52 is formed by using conventional fabrication techniques.

Lastly, the field effect transistors are formed and completed using conventional semiconductor fabrication techniques.

This invention has many advantages over the conventional buried layer MOS structures. First, the trench allows for a smooth topology over the buried conductive line regions which improves device yields. Device yields are increased because the photolithography depth of field problems are eliminated. Also, the smooth topology eliminates the polysilicon conductive line notching problems.

Second, the structure of a first lightly doped layer 32 (threshold voltage layer) and second lightly doped layer 34 (anti-punchthrough layer) increase the punchthrough voltage for the device between two adjacent buried conductive regions. These implants are important to this invention because the anti-punchthrough implant can use a higher dosage to improve punchthrough voltage without sacrificing the device's threshold voltage. This allows for smaller channel lengths and smaller geometry MOS devices.

Third, the first and second buried conductive regions have the lowest resistance for a given line pitch (width). The invention provides a lower resistance for a give buried line pitch than is possible with the prior art. The first buried region lowers the resistivity without lowering the threshold voltage or punch through voltage.

While the invention has been particularly shown and described with reference to the preferred embodiments thereof, it will be understood by those skilled in the art that various changes in form and details may be made without departing from the spirit and scope of the invention.

What is claimed is:

1. An improved field effect transistor device having recessed lower source and drain regions, and lightly doped upper source and drain regions, in a semiconductor substrate comprising:

a semiconductor substrate having a background doping of a first conductivity type, said substrate having an impurity concentration in the range of 1E14 to 1E15 atoms/cm$^3$;

spaced recessed lower source and drain regions having impurities of a second conductivity type formed within recesses within said semiconductor substrate, said spaced recessed lower source and drain regions having an impurity concentration in the range between 1E20 to 1E21 atoms/cm$^3$;

a thin gate insulating layer on a substrate surface between said spaced recessed lower source and drain regions;

thick oxide regions filling said recesses over said lower source and drain regions, a top surface of each of said thick oxide regions being level with said thin gate insulating layer, each of said thick oxide regions having vertical sides and a bottom;

lightly doped upper source and drain regions along the sides of said thick oxide regions adjacent to and above said recessed lower source and drain regions, each of said lightly doped upper source and drain regions having an impurity of the second conductivity type with a concentration in the range between 1E18 to 1E19 atoms/cm$^3$;

a conductive gate electrode region on the surface of said substrate overlying the area between said upper source and drain regions;

an anti-punchthrough layer located at a depth under the substrate surface in the range of about 2000 to 3500 Å, said anti-punchthrough layer formed of an impurity of the first conductivity type with a concentration in the range of 1E16 to 1E18 atoms/cm$^3$; and a threshold voltage layer located at a depth below the substrate surface in the range of 600 to 1200 Å.

* * * * *